United States Patent
Tzu

(10) Patent No.: US 7,119,420 B2
(45) Date of Patent: Oct. 10, 2006

(54) CHIP PACKAGING STRUCTURE ADAPTED TO REDUCE ELECTROMAGNETIC INTERFERENCE

(75) Inventor: Chung-Hsing Tzu, Taipei (TW)

(73) Assignee: Domintech Co., Ltd., Taipei (TW)

( * ) Notice: Subject to any disclaimer, the term of this patent is extended or adjusted under 35 U.S.C. 154(b) by 0 days.

(21) Appl. No.: 11/165,170

(22) Filed: Jun. 24, 2005

(65) Prior Publication Data

US 2006/0170082 A1    Aug. 3, 2006

(30) Foreign Application Priority Data

Feb. 1, 2005    (TW) .............................. 94201846 U

(51) Int. Cl.
*H01L 23/552*    (2006.01)
*H01L 23/52*    (2006.01)
*H01L 23/495*    (2006.01)

(52) U.S. Cl. ...................... 257/659; 257/666; 257/691; 257/782; 257/E23.054

(58) Field of Classification Search ................ 257/659, 257/E23.054, 782, 691
See application file for complete search history.

(56) References Cited

U.S. PATENT DOCUMENTS 6,614,102 B1 *    9/2003    Hoffman et al. ............. 257/666
7,042,071 B1 *    5/2006    Minamio et al. ........... 257/670

* cited by examiner

*Primary Examiner*—Long Tran
(74) *Attorney, Agent, or Firm*—Birch, Stewart, Kolasch & Birch, LLP

(57) ABSTRACT

A chip packaging structure adapted to reduce EMI includes a chip having contacts provided on one side thereof, and a leadframe having a plurality of leads arranged in a predetermined manner and provided at a bottom side with a conducting protrusion each for electrically connecting to external elements. The leadframe is fixedly attached to one side of the chip having the contacts provided thereon, and the leads are electrically connected at inner ends to the contacts via lead wires. An adhesive layer is applied to one side of the leadframe having the protrusions to thereby adhere a conducting layer to the leadframe with the protrusions downward extended through multiple through holes on the conducting layer; and at least one of the contacts on the chip is electrically connected to the conducting layer for the latter to serve as a ground or a power plane.

6 Claims, 5 Drawing Sheets

CHIP PACKAGING STRUCTURE ADAPTED TO REDUCE ELECTROMAGNETIC INTERFERENCE

FIELD OF THE INVENTION

The present invention relates to a chip packaging structure, and more particularly to a chip packaging structure that is adapted to reduce electromagnetic interference and improve transmission rate.

BACKGROUND OF THE INVENTION

It is known that electronic products in operation produce electromagnetic interference (EMI), noises, including shot noise, flicker noise, surge noise, thermal noise, partition noise, etc., as well as high temperature. Most of the noises are produced due to electromagnetic interference and have adverse influences on the stability of the whole electronic system. It is difficult to completely overcome the electromagnetic interference, which must be, however, reduced to be lower than a standard value through proper circuit design or shielding and grounding structures for the electronic elements, so as to achieve the purpose of electromagnetic compatibility.

In a conventional chip packaging structure, a chip is positioned on a chip pad and a leadframe is provided at each lateral side of the chip to electrically connect with external elements. Each leadframe includes a plurality of sequentially arranged leads, which are connected to contacts on the chip via gold wires. An insulating sealing material is applied to enclose the chip and thereby protects and locates the chip, the gold wires, and other internal elements in place. However, the above-described conventional chip packaging structure does not include any structural design for preventing electromagnetic interference to meet the high standard of electromagnetic compatibility required by current electronic products.

SUMMARY OF THE INVENTION

A primary object of the present invention is to provide a chip packaging structure that is effectively isolated from electrical noises and adapted to reduce electromagnetic interference, and enables increased transmission rate.

Another object of the present invention is to provide a chip packaging structure adapted to reduce electromagnetic interference that requires a reduced amount of sealing material to seal the chip thereof.

To achieve the above and other objects, the chip packaging structure adapted to reduce electromagnetic interference according to the present invention includes a chip having electric contacts provided on one side thereof, and a leadframe having a plurality of leads arranged in a predetermined manner and provided at a bottom side with a conducting protrusion each for electrically connecting to external elements. The leadframe is fixedly attached to one side of the chip having the electric contacts provided thereon, and the leads are electrically connected at inner ends to the electric contacts via lead wires. An adhesive layer is applied to one side of the leadframe having the protrusions to thereby adhere a conducting layer to the leadframe with the protrusions on the leads downward extended through multiple through holes formed on the conducting layer; and at least one of the electric contacts on the chip is electrically connected to the conducting layer for the latter to serve as a ground or a power plane.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
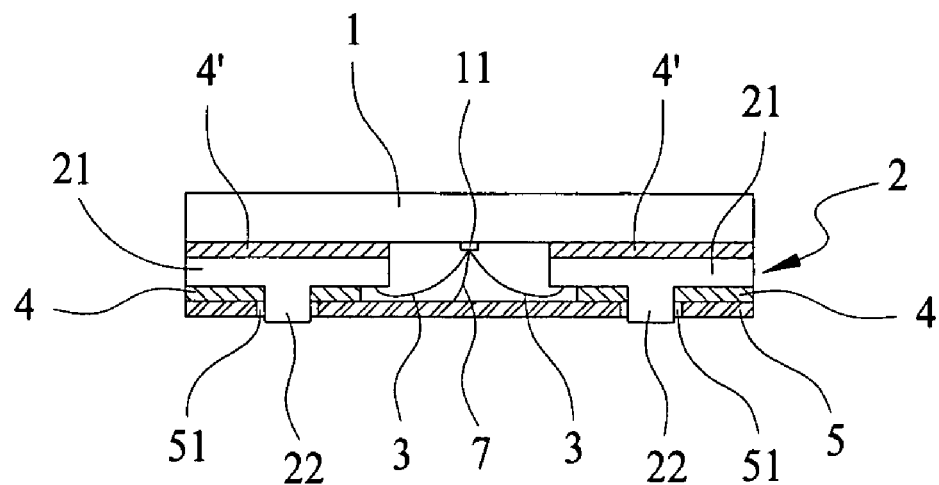
FIG. 1 is a sectional view of a chip packaging structure according to a first embodiment of the present invention.

Please refer to FIG. 1 that is a sectional view of a chip packaging structure according to a first embodiment of the present invention. As shown, the chip packaging structure of the present invention mainly includes a chip 1, a leadframe 2, a plurality of lead wires 3, at least one adhesive layer 4, and a conducting layer 5.

The chip 1 is an electronic element made of known semiconductor materials, and provided at a predetermined side with a plurality of electrical contacts 11.

Figure 4:
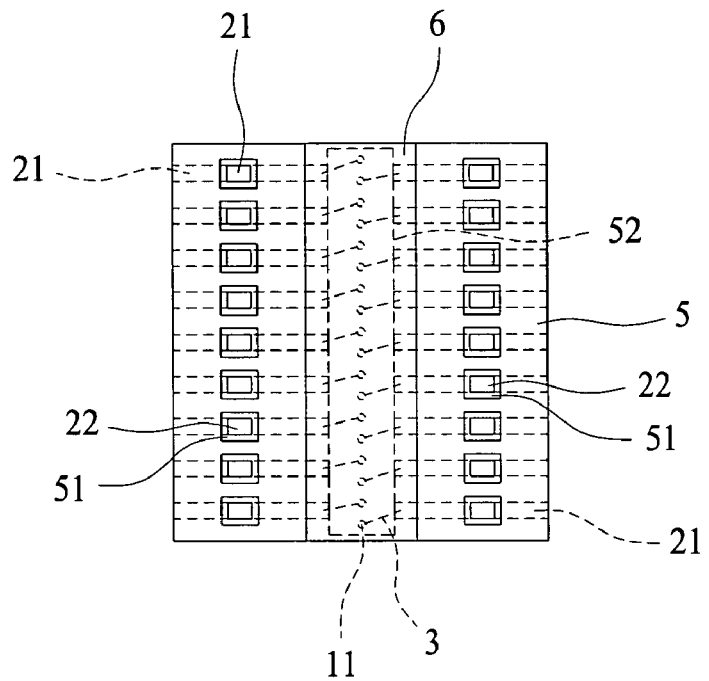
FIG. 4 schematically shows the chip packaging structure of the present invention with leads on a leadframe arranged at two opposite sides of the chip.
Figure 5:
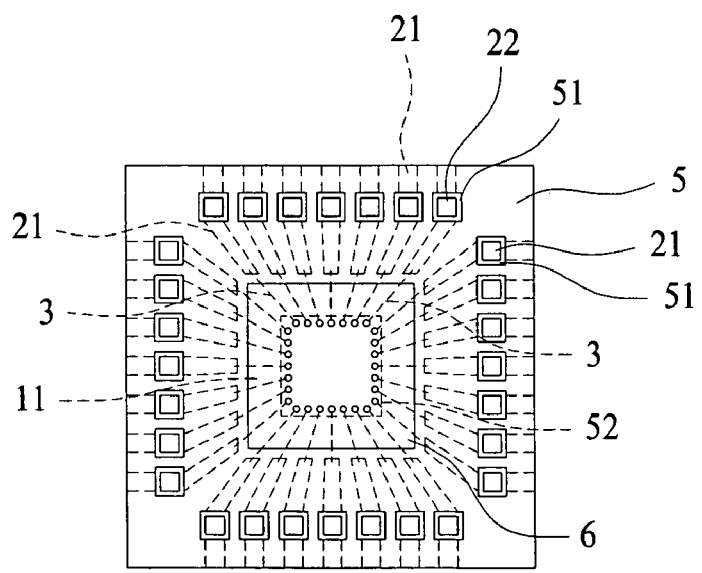
FIG. 5 schematically shows the chip packaging structure of the present invention with leads on a leadframe arranged at four sides of the chip.

The leadframe 2 is a metal sheet being pressed to form a plurality of leads 21, which are arranged either at two opposite sides of the chip 1 in two parallel rows, as shown in FIG. 4, or at four sides of the chip 1 like a matrix, as shown in FIG. 5. Each of the leads 21 is provided on a bottom side at a predetermined point with a protrusion 22 for electrically connecting to external elements. In an embodiment of the present invention, the protrusions 22 on each row of the leads 21 are aligned with one another.

The lead wires 3 are metal conductors, such as gold wires, electrically connecting the electrical contacts 11 on the chip 1 to the leads 21 on the leadframe 2.

The adhesive layer 4 may be, for example, a liquid substance, such as glue that provides a bonding ability after becoming dried, or a tape with insulating ability.

Figure 3:
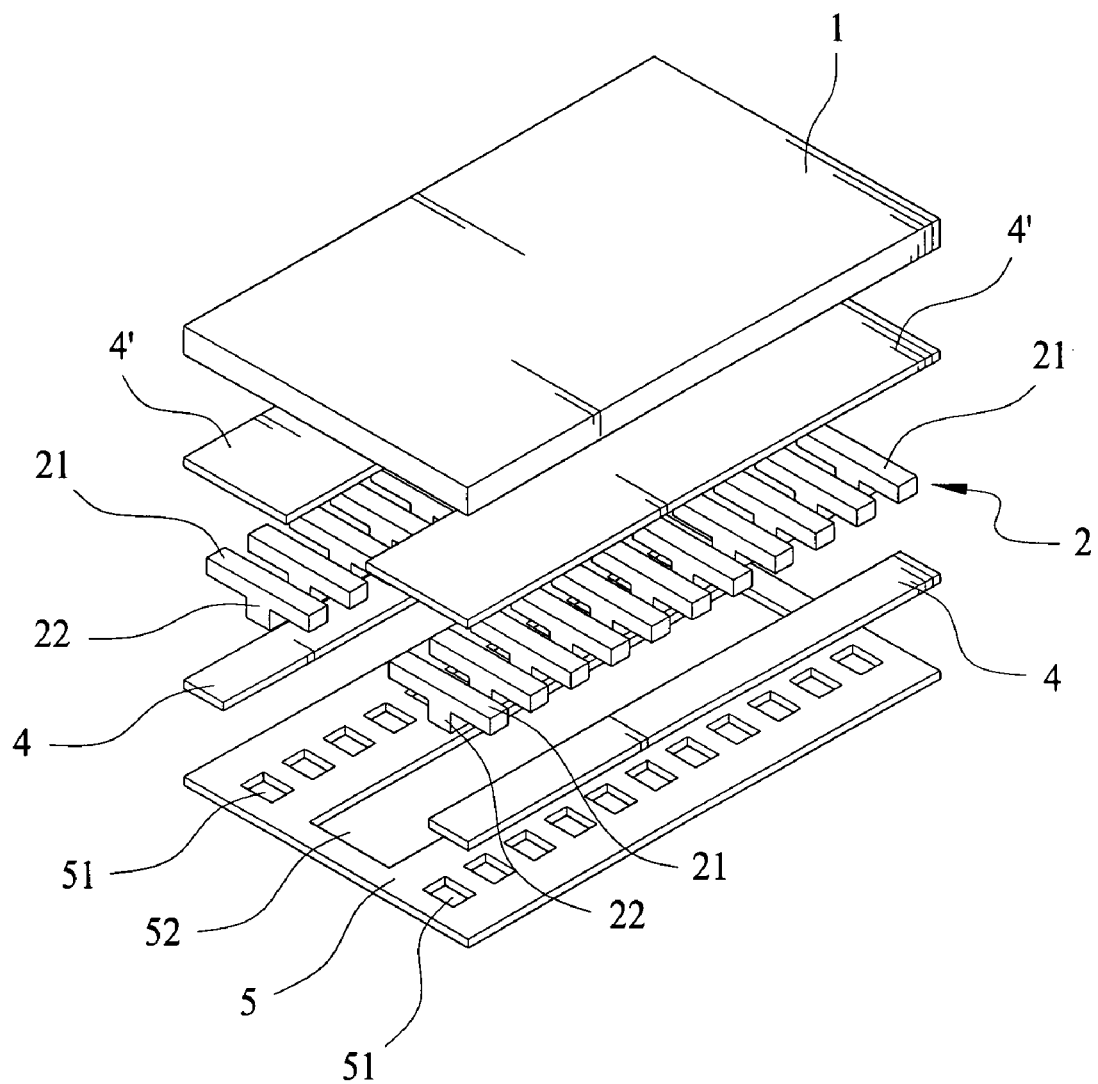
FIG. 3 is a partially exploded perspective view of the chip packaging structure of FIG. 2.

The conducting layer 5, as can be clearly seen from FIG. 3, may be a metal sheet or a metal film, and is provided with a plurality of through holes 51 corresponding to the protrusions 22 on the leads 21 of the leadframe 2.

In the chip packaging structure according to the first embodiment of the present invention shown in FIG. 1, the leadframe 2 is fixedly attached to the side of the chip 1 having the electrical contacts 11 provided thereon, such that the protrusions 22 on the leads 21 of the leadframe 2 are located closer to lateral outer sides of the leadframe 2, and the leads 21 are connected at respective inner ends to the electrical contacts 11 on the chip 1 via the lead wires 3. Meanwhile, the adhesive layer 4 is applied to one side of the leadframe 2 having the protrusions 22 provided thereon to thereby adhere the conducting layer 5 to the leadframe 2 with the protrusions 22 on the leads 21 extended through the through holes 51 on the conducting layer 5, and at least one of the electrical contacts 11 on the chip 1 is electrically connected to the conducting layer 5 for the latter to serve as a ground plane or a power plane of the packaged chip 1. With the above arrangements, the chip packaging structure of the present invention is effectively isolated from electrical noises and adapted to reduce electromagnetic interference (EMI), and enables increased transmission rate. Wherein, the leadframe 2 is fixedly attached to the chip 1 via another adhesive layer 4', which may be, for example, the above-mentioned liquid substance, such as glue, which provides a bonding ability after becoming dried, or the tape.

Briefly speaking, with the ground plane or the power plane formed by the conducting layer 5, the chip packaging structure of the present invention has the advantages of being effectively isolated from electrical noises and adapted to reduce electromagnetic interference (EMI), and enabling increased transmission rate. Meanwhile, since the conducting layer 5 is formed from a metal sheet or film and adhered to an outer side of the leadframe 2 by the adhesive layer 4 to seal areas having the electrical contacts 11 on the chip 1 and the lead wires 3 provided thereat (see FIG. 1), sealing material for the same purpose may therefore be saved.

Figure 2:
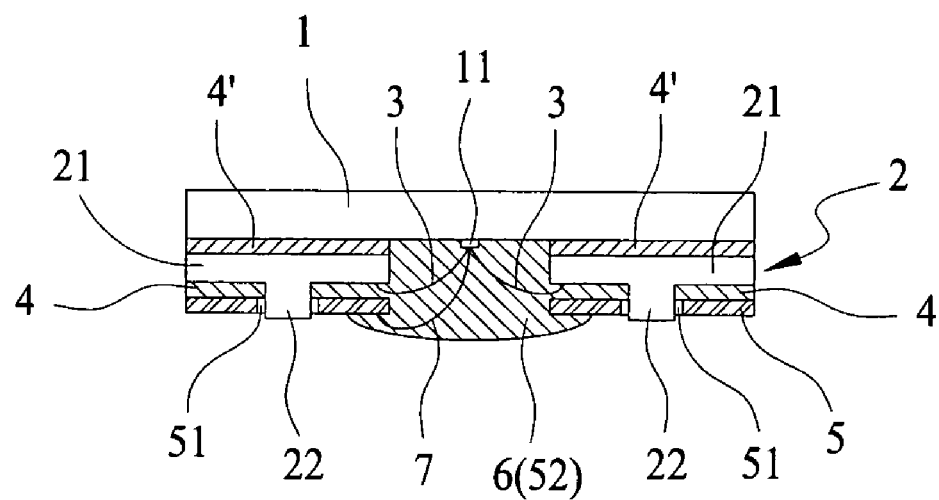
FIG. 2 is a sectional view of the chip packaging structure according to a second embodiment of the present invention.

FIG. 2 is a sectional view of a chip packaging structure according to a second embodiment of the present invention. In this second embodiment, the conducting layer 5 is formed at a predetermined position with an opening 52 corresponding to the area of the chip 1 having the electrical contacts 11. The conducting layer 5 shown in FIGS. 3 and 4 is provided with the opening 52. After the chip 1, the leadframe 2, the adhesive layer 4, and the conducting layer 5 are assembled in the above-described manner to form the chip packaging structure, the electrical contacts 11 on the chip 1 are electrically connected to the leads 21 and at least one of the electrical contacts 11 is electrically connected to the conducting layer 5 via the lead wires 3 at the opening 52 of the conducting layer 5, and a sealing material 6 is locally applied to the opening 52 to protectively seal the electrical contacts 11 and the lead wires 3 behind the opening 52 of the conducting layer 5. In the second embodiment, the conducting layer 5 again enables the chip packaging structure of the present invention to have the advantages of being effectively isolated from electrical noises and adapted to reduce electromagnetic interference (EMI) to allow increased transmission rate.

Please refer to FIGS. 1 and 2. The conducting layer 5 is electrically connected to at least one of the electrical contacts 11 on the chip 1 via an electrically conducting body 7, such as a metal wire extended between the electrical contact 11 and the conducting layer 5, so that the conducting layer 5 serves as a ground plane or a power plane for the chip packaging structure of the present invention to have the above-mentioned advantages.

Figure 6:
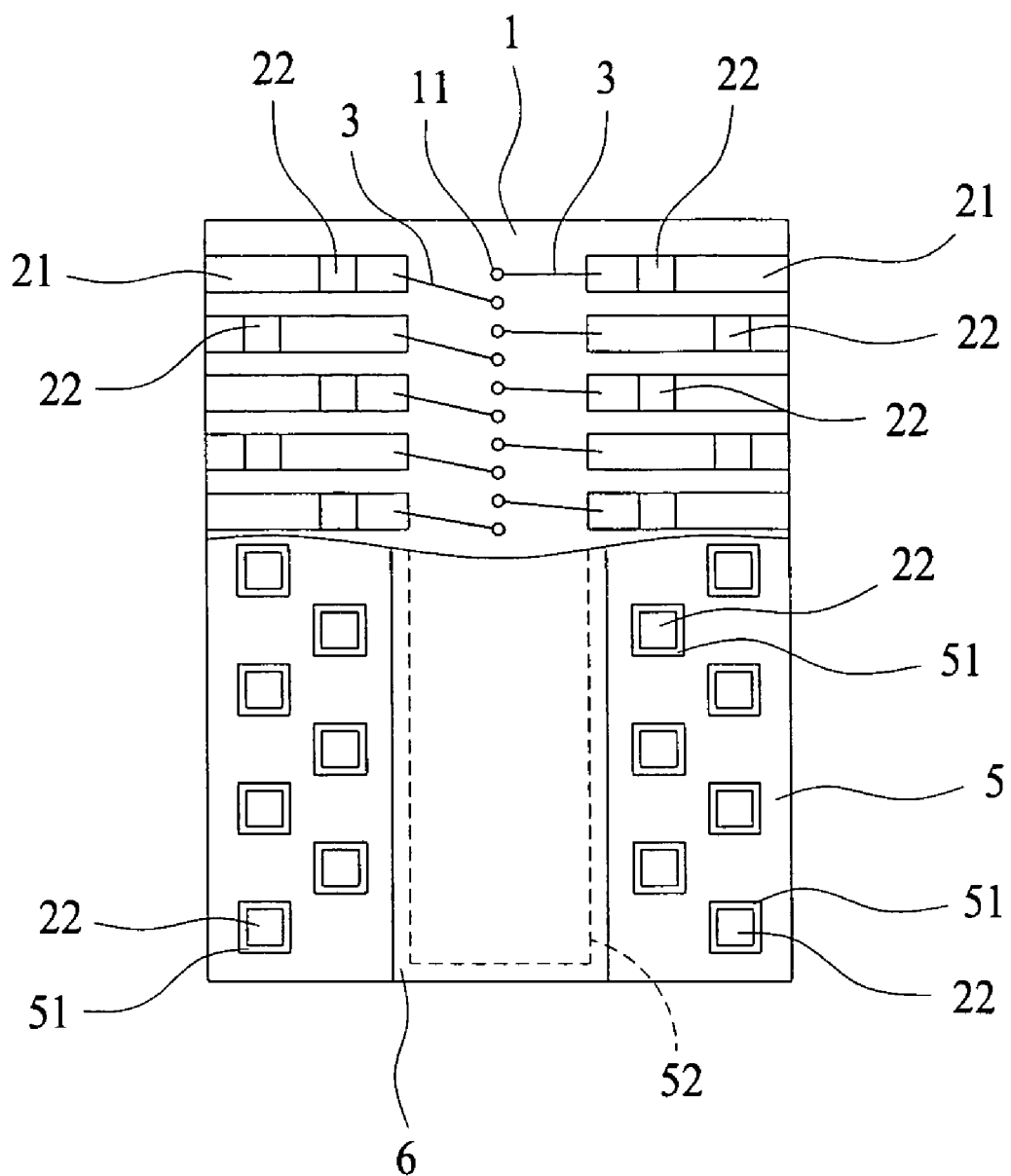
FIG. 6 schematically shows the chip packaging structure of the present invention with protrusions for electrically connecting to external elements staggered on leads of the leadframe and through holes correspondingly staggered on a conducting layer below the leadframe.

Please refer to FIG. 6 that shows another embodiment of the present invention having the protrusions 22 staggered on each row of the leads 21. Since the through holes 51 on the conducting layer 5 are arranged corresponding to the protrusions 22, the through holes 51 in this embodiment are also staggered for the protrusions 22 to downward expose therefrom to electrically connect to other electronic apparatus, such as a circuit board. In this manner, overflow of solder during the electrical connection of the leads 21 to the lead wires 3 may be avoided to prevent short circuit and ensure high good yield of the chip packaging structure in actual applications thereof.

Figure 7:
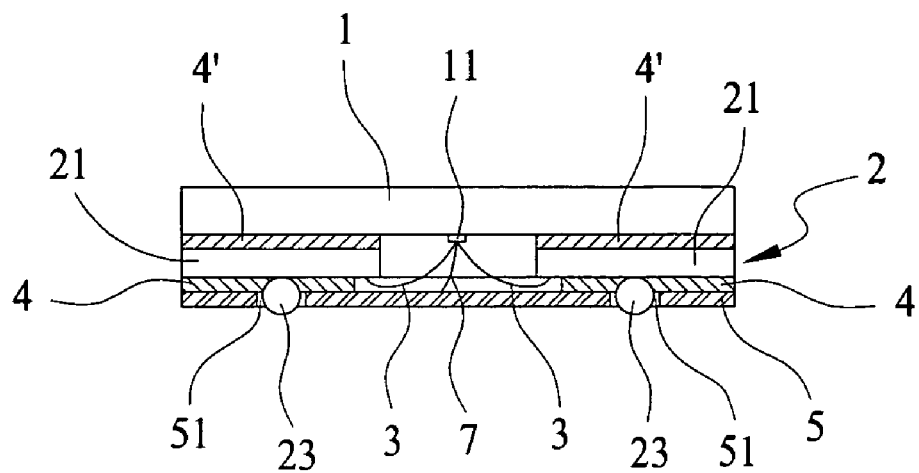
FIG. 7 is a sectional view of the chip packaging structure of the present invention with ball-shaped protrusions for electrically connecting to external elements.
Figure 8:
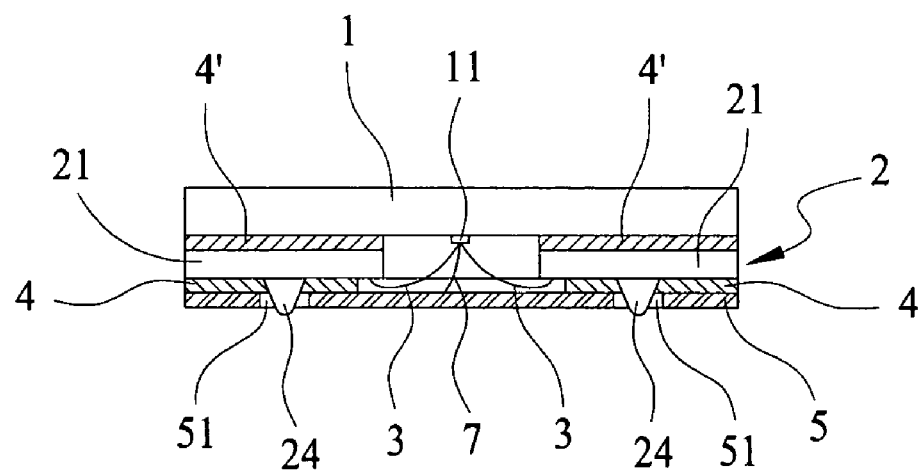
FIG. 8 is a sectional view of the chip packaging structure of the present invention with cone-shaped protrusions for electrically connecting to external elements.

It is noted that the protrusions 22 at the bottom side of the leads 21 of the leadframe 2 are not necessarily integrally formed on the leads 21. In an embodiment of the present invention as shown in FIG. 7, ball-shaped conducting protrusions 23, such as solder balls, are attached to the bottom side of the leads 21 corresponding to the through holes 51 on the conducting layer 5. And, in another embodiment of the present invention as shown in FIG. 8, cone-shaped conducting protrusions 24 are attached to the bottom side of the leads 21 corresponding to the through holes 51 on the conducting layer 5. It is understood that any other differently shaped conducting protrusions are also acceptable for use in the present invention. In the chip packaging structure having the ball-shaped or the cone-shaped conducting protrusions 23 or 24 downward projected from the through holes 51, and at least one of the electrical contacts 11 on the chip 1 electrically connected to the conducting layer 5, the conducting layer 5 may also serve as a ground plane or a power plane for the chip packaging structure to have the above-mentioned advantages.

What is claimed is:

1. A chip packaging structure adapted to reduce electromagnetic interference, comprising a chip having a plurality of electrical contacts provided on one side thereof, and a leadframe having a plurality of leads that are arranged in a predetermined manner and provided at one side with a protrusion each for electrically connecting to external elements; said chip packaging structure being characterized in that said leadframe are fixedly attached to the side of said chip having said electrical contacts provided thereon, such that said protrusions on said leads of said leadframe are located closer to lateral outer sides of said leadframe; that said leads are connected at respective inner ends to said electrical contacts on said chip via lead wires; that an adhesive layer is applied to one side of said leadframe having said protrusions provided thereon to thereby adhere a conducting layer in the form of a sheet to said leadframe with said protrusions on said leads downward extended through multiple rows of through holes formed on said conducting layer corresponding to said protrusions on said leads; and that at least one of said electrical contacts on said chip is electrically connected to said conducting layer.

2. The chip packaging structure adapted to reduce electromagnetic interference as claimed in claim 1, wherein said conducting layer is electrically connected to said at least one electrical contact on said chip via an electrically conducting body, so that said conducting layer serves as a ground plane or a power plane in said chip packaging structure.

3. The chip packaging structure adapted to reduce electromagnetic interference as claimed in claim 1, wherein said through holes formed on said conducting layer are aligned with one another in each row thereof.

4. The chip packaging structure adapted to reduce electromagnetic interference as claimed in claim 1, wherein said through holes formed on said conducting layer are staggered in each row thereof.

5. The chip packaging structure adapted to reduce electromagnetic interference as claimed in claim 1, wherein said conducting layer is provided at a position corresponding to an area of said chip having said electrical contacts provided thereon with an opening, into which a sealing material is applied to seal said electrical contacts and said lead wires behind said opening.

6. The chip packaging structure adapted to reduce electromagnetic interference as claimed in claim 1, wherein said protrusions provided on said leads of said leadframe are selected from the group consisting of ball-shaped conducting protrusions, cone-shaped conducting protrusions, and any other geometrically shaped conducting protrusions.

* * * * *